(12) United States Patent
Fischer et al.

(10) Patent No.: US 9,562,933 B2
(45) Date of Patent: Feb. 7, 2017

(54) DIAGNOSTIC METHOD FOR MULTIPLE SPEED RELAY-CONTROLLED ELECTRIC FAN

(71) Applicant: Ford Global Technologies, LLC, Dearborn, MI (US)

(72) Inventors: Troy Fischer, Novi, MI (US); Jayne Froney, Livonia, MI (US); Randall J. Houston, Royal Oak, MI (US); Brian D. Rutkowski, Ypsilanti, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 112 days.

(21) Appl. No.: 14/095,845

(22) Filed: Dec. 3, 2013

(65) Prior Publication Data

US 2015/0152776 A1    Jun. 4, 2015

(51) Int. Cl.
| | | |
|---|---|---|
| *G01R 31/02* | (2006.01) | |
| *G01R 19/165* | (2006.01) | |
| *G01R 31/00* | (2006.01) | |
| *G01M 15/04* | (2006.01) | |
| *F01P 5/14* | (2006.01) | |
| *F01P 11/18* | (2006.01) | |

(52) U.S. Cl.
CPC ........... *G01R 19/16533* (2013.01); *F01P 5/14* (2013.01); *F01P 11/18* (2013.01); *G01M 15/042* (2013.01); *G01R 31/006* (2013.01)

(58) Field of Classification Search
CPC ... H02P 5/68; G05D 23/1917; H05K 7/20727; F04D 27/0004

USPC .......................... 324/503, 545; 318/471, 472
See application file for complete search history.

(56) References Cited

U.S. PATENT DOCUMENTS

| | | | |
|---|---|---|---|
| 5,738,049 A | 4/1998 | Ninomiya | |
| 6,009,362 A | 12/1999 | Furukawa | |
| 6,344,636 B1 | 2/2002 | Kim | |
| 6,829,530 B2 | 12/2004 | Mauro et al. | |
| 7,282,921 B2 | 10/2007 | Sela et al. | |
| 2002/0093299 A1* | 7/2002 | Kobayashi | ................. 318/34 |
| 2005/0118029 A1* | 6/2005 | Kim | ................. 417/18 |
| 2009/0115620 A1* | 5/2009 | Hunter et al. | ................. 340/664 |
| 2009/0151369 A1* | 6/2009 | Lifson et al. | ................. 62/115 |
| 2010/0066097 A1* | 3/2010 | Verdejo | ................. B60K 6/46 |
| | | | 290/40 A |
| 2011/0199036 A1 | 8/2011 | Wiltsch | |
| 2012/0009863 A1* | 1/2012 | Sun et al. | ................. 454/228 |
| 2012/0312030 A1* | 12/2012 | Lu | ................. 62/3.6 |

FOREIGN PATENT DOCUMENTS

DE         102006016779 A1    10/2007

\* cited by examiner

*Primary Examiner* — Vincent Q Nguyen
(74) *Attorney, Agent, or Firm* — Julia Voutyras; Alleman Hall McCoy Russell & Tuttle LLP

(57) ABSTRACT

Methods and systems are described for diagnosing a multiple speed, relay controlled engine cooling fan system. One method includes measuring the change in current drawn from a battery-alternator system when fan speed is modified. A degradation in cooling fan operation is flagged when measured current change differs from an expected change.

20 Claims, 5 Drawing Sheets

US 9,562,933 B2

DIAGNOSTIC METHOD FOR MULTIPLE SPEED RELAY-CONTROLLED ELECTRIC FAN

TECHNICAL FIELD

The present application relates to diagnosing a multiple-speed engine cooling fan system of a vehicle cooling system.

BACKGROUND AND SUMMARY

Vehicle cooling systems may include various cooling components such as radiators, cooling fans and blowers, condensers, liquid coolant, etc. An electro-drive engine cooling fan may be powered by an electric motor that is either variable speed or relay controlled. An electric fan controlled by a variable speed motor may be diagnosed by smart controllers connected to the powertrain control module (PCM).

Another example approach is shown by Wiltsch (US 2001/0199036) where a cooling fan is diagnosed by measuring current after the fan is triggered by a predefined signal. A current measuring device is coupled to a fan which can be triggered "on", "off" or to an intermediate position. The device detects a current signal after the fan is triggered which is then compared with a predefined threshold. Any deviation from the predefined threshold results in a determination of a degraded fan.

The inventors herein have identified potential issues with the above approaches. In the example of a relay controlled fan, there is limited diagnostic capability due to the lack of smart controllers. This problem is particularly exacerbated for a fan system with multiple speeds which include several relays. Likewise, with regard to the current measurement approach, errors can be introduced in the vehicle electrical system due to the presence of other electrical loads that may be drawing current from the same voltage source as the fan, and unexpected or unknown transitions in such loads. Thus, interference from such electrical loads can result in erroneous current measurements for the fan and, consequently, lead to an incorrect diagnosis regarding cooling fan degradation.

The inventors herein have recognized the above issue and identified an approach to at least partly address the issue. In one example approach, a diagnostic method for a multiple speed, relay controlled fan system is provided. The method comprises measuring the change in current drawn from a battery-alternator system as fan speeds are varied during vehicle travel at lower speeds while other electrical loads are maintained in a more stable condition. Further, the difference between current drawn before and after a fan speed modification is compared with an expected change and a degradation is indicated if the absolute of a relative current change is more than an expected error threshold.

For example, while the vehicle is traveling at low speeds and larger electric loads like an air conditioner or defogger are in a stable condition, a fan diagnostic may be enabled. The PCM may command a change in fan speed and once the speed is stabilized, multiple current draw readings are acquired. For example, the fan speed may be changed from a stop or "off" position to a "low" speed state. Prior to changing the speed, the current drawn from the battery and alternator when the fan system is at an "off" position may be measured. Once the fan speed at "low" speed position has stabilized, the current drawn from the battery-alternator system may be measured. The difference between current drawn at an "off" position and current drawn at "low" speed may be calculated and compared with an expected difference to arrive at a relative error based on an expected change. If the absolute error calculated is more than an expected threshold, fan degradation may be detected. A malfunction indicator lamp may be lit on the dashboard after multiple degradation detections.

In this way, a multiple speed cooling fan system operated by relay controlled motors can be examined for degradation without any additional changes to existing hardware or the need for extra sensors, thereby, minimizing costs. By carrying out the diagnosis when other electrical loads are under more stable conditions, or by delaying requested changes in the other electrical loads, any change in current drawn from the battery-alternator system can be ascribed to the cooling fan system. Further, the cooling fan diagnostic may be disabled when other electric loads are fluctuating to minimize noise and errors.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
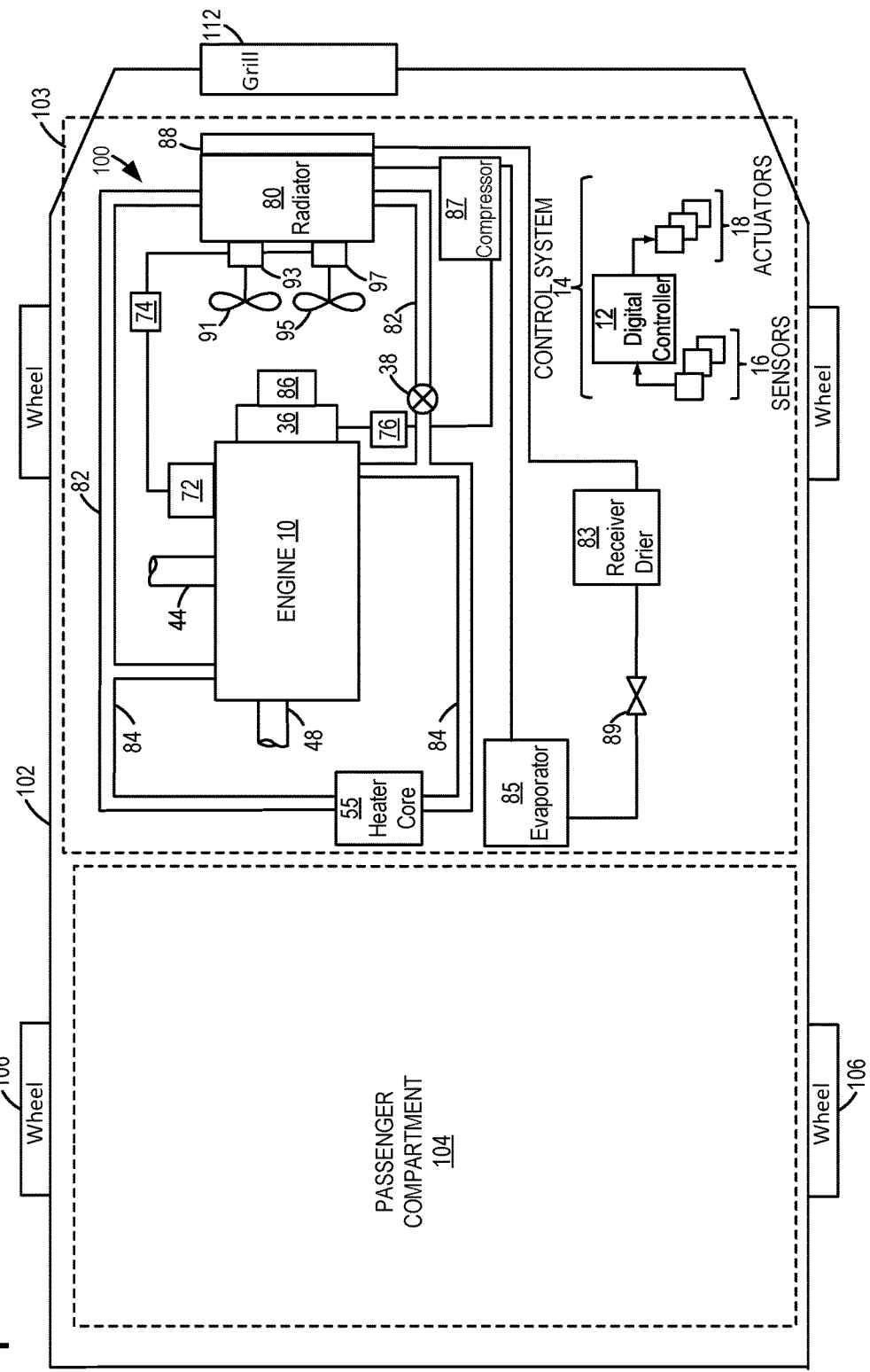
FIG. 1 portrays a schematic diagram of a cooling system in a motor vehicle.
Figure 2:
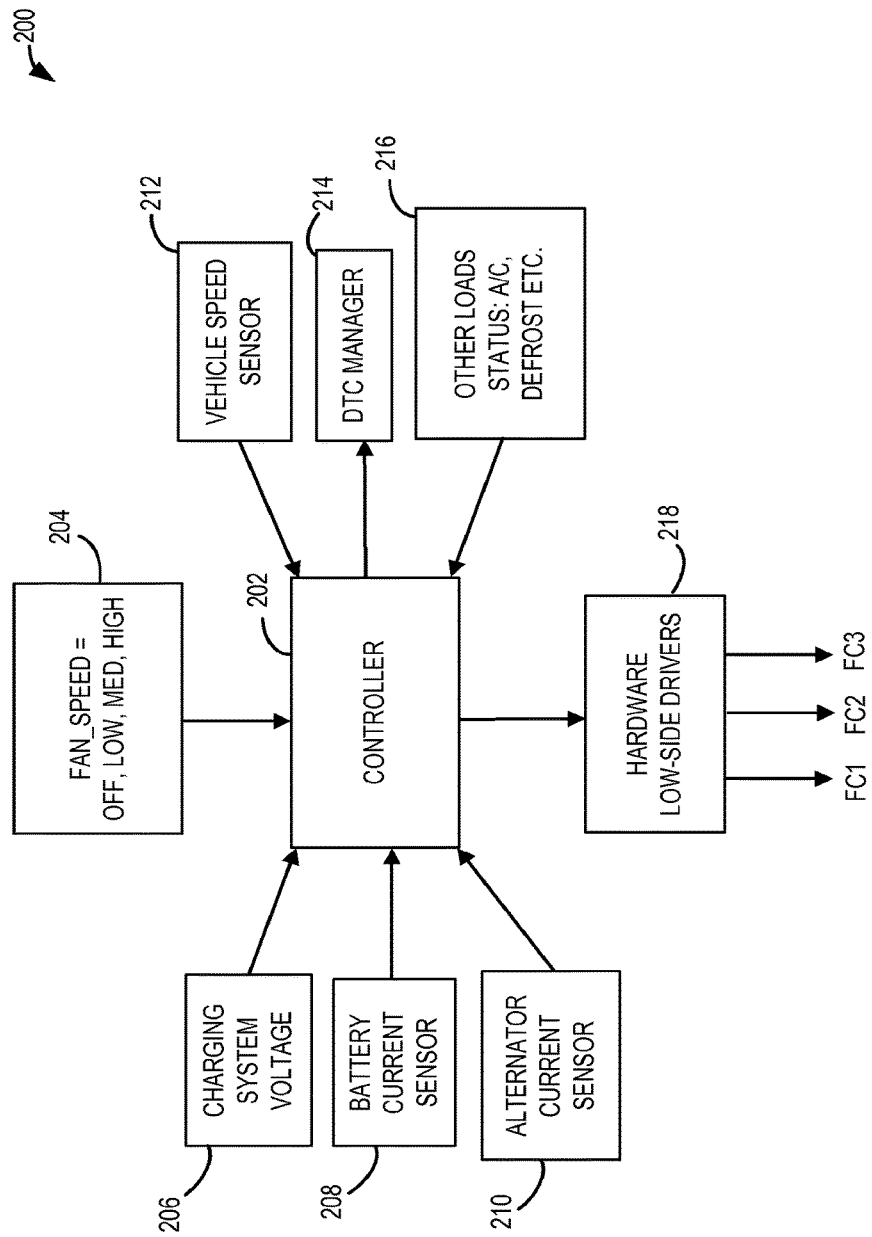
FIG. 2 depicts an example block diagram of a fan diagnostic logic.

The following description relates to systems and methods for diagnosing a cooling fan system in a vehicle cooling system, such as that in FIG. 1. Multiple speed fans using electric motors controlled by relays, such as those shown in FIGS. 3A, 3B and 3C, may be diagnosed for degradation by an example fan diagnostic logic as depicted in FIG. 2. A controller may be configured to perform a routine, such as the example routine of FIG. 4, to detect cooling fan degradation based on relative current drawn from the alternator-battery system. The diagnostic is activated when certain vehicle conditions are met, particularly that of other electrical loads being stable (FIG. 5).

FIG. 1 is a schematic depiction of an example embodiment of vehicle cooling system 100 in a motor vehicle 102. Vehicle 102 has drive wheels 106, a passenger compartment 104, and an under-hood compartment 103. Under-hood compartment 103 may house various under-hood components under the hood (not shown) of motor vehicle 102. For example, under-hood compartment 103 may house internal combustion engine 10. Internal combustion engine 10 has a combustion chamber which may receive intake air via intake passage 44 and may exhaust combustion gases via exhaust passage 48. In one example, intake passage 44 may be configured as a ram-air intake wherein the dynamic pressure created by moving vehicle 102 may be used to increase a static air pressure inside the engine's intake manifold. As such, this may allow a greater mass flow of air through the engine, thereby increasing engine power. Engine 10 as illustrated and described herein may be included in a vehicle such as a road automobile, among other types of vehicles. While the example applications of engine 10 will be described with reference to a vehicle, it should be appreciated that various types of engines and vehicle propulsion systems may be used, including passenger cars, trucks, etc.

Under-hood compartment 103 may further include cooling system 100 that circulates coolant through internal combustion engine 10 to absorb waste heat, and distributes the heated coolant to radiator 80 and/or heater core 55 via coolant lines 82 and 84, respectively. In one example, as depicted, cooling system 100 may be coupled to engine 10 and may circulate engine coolant from engine 10 to radiator 80 via engine-driven water pump 86, and back to engine 10 via coolant line 82. Engine-driven water pump 86 may be coupled to the engine via front end accessory drive (FEAD) 36, and rotated proportionally to engine speed via a belt, chain, etc. Specifically, engine-driven pump 86 may circulate coolant through passages in the engine block, head, etc., to absorb engine heat, which is then transferred via the radiator 80 to ambient air. In one example, where engine-driven water pump 86 is a centrifugal pump, the pressure (and resulting flow) produced by the pump may be proportional to the crankshaft speed, which in the example of FIG. 1, may be directly proportional to the engine speed. The temperature of the coolant may be regulated by a thermostat valve 38, located in the cooling line 82, which may be kept closed until the coolant reaches a threshold temperature.

Coolant may flow through coolant line 82, as described above, and/or through coolant line 84 to heater core 55 where the heat may be transferred to passenger compartment 104, and the coolant flows back to engine 10. In some examples, engine-driven pump 86 may operate to circulate the coolant through both coolant lines 82 and 84.

One or more blowers (not shown) and cooling fans may be included in cooling system 100 to provide airflow assistance and augment a cooling airflow through the under-hood components. For example, cooling fans 91 and 95, coupled to radiator 80, may be operated when the vehicle is moving and the engine is running to provide cooling airflow assistance through radiator 80. Cooling fans 91 and 95 may draw a cooling airflow into under-hood compartment 103 through an opening in the front-end of vehicle 102, for example, through grill 112. Such a cooling air flow may then be utilized by radiator 80 and other under-hood components (e.g., fuel system components, batteries, etc.) to keep the engine and/or transmission cool. Further, the air flow may be used to reject heat from a vehicle air conditioning system. Further still, the airflow may be used to improve the performance of a turbocharged/supercharged engine that is equipped with intercoolers that reduce the temperature of the air that goes into the intake manifold/engine. While this embodiment depicts two cooling fans, other examples may use only a single cooling fan.

Cooling fans 91 and 95 may be coupled to battery driven motors 93 and 97, respectively. During engine operation, the engine generated torque may be transmitted to alternator 72 along a drive shaft (not shown), which may then be used by alternator 72 to generate electrical power, that may be stored in an electrical energy storage device, such as system battery 74. Battery 74 may then be used to activate electric cooling fan motors 93 and 97 via relays (not shown). Thus, operating the cooling fan system may include electrically powering cooling fan rotation from engine rotational input, through the alternator and system battery, for example, when engine speed is below a threshold (for example, when the engine is in idle-stop). In other embodiments, the cooling fan may be operated by enabling a variable speed electric motor coupled to the cooling fan. In still other embodiments, cooling fans 91 and 95 may be mechanically coupled to engine 10 via a clutch (not shown) and operating the cooling fans may include mechanically powering their rotation from engine rotational output via the clutch.

Under-hood compartment 103 may further include an air conditioning (AC) system comprising condenser 88, compressor 87, receiver drier 83, expansion valve 89, and evaporator 85 coupled to a blower (not shown). Compressor 87 may be coupled to engine 10 via FEAD 36 and electromagnetic clutch 76 (also known as compressor clutch 76) which allows the compressor to engage or disengage from the engine based on when the air conditioning system is turned on and switched off. Compressor 87 may pump pressurized refrigerant to condenser 88 mounted at the front of the vehicle. Condenser 88 may be cooled by cooling fans 91 and 95, thereby, cooling the refrigerant as it flows through. The high pressure refrigerant exiting condenser 88 may flow through receiver drier 83 where any moisture in the refrigerant may be removed by the use of desiccants. Expansion valve 89 may then depressurize the refrigerant and allow it to expand before it enters evaporator 85 where it may be vaporized into gaseous form as passenger compartment 104 is cooled. Evaporator 85 may be coupled to a blower fan operated by a motor (not shown) which may be actuated by system voltage.

System voltage may also be used to operate an entertainment system (radio, speakers, etc.), electrical heaters, windshield wiper motors, rear window defrosting system and headlights amongst other systems.

FIG. 1 further shows a control system 14. Control system 14 may be communicatively coupled to various components of engine 10 to carry out the control routines and actions described herein. For example, as shown in FIG. 1, control system 14 may include an electronic digital controller 12. Controller 12 may be a microcomputer, including a microprocessor unit, input/output ports, an electronic storage medium for executable programs and calibration values, random access memory, keep alive memory, and a data bus. As depicted, controller 12 may receive input from a plurality of sensors 16, which may include user inputs and/or sensors (such as transmission gear position, gas pedal input, brake input, transmission selector position, vehicle speed, engine speed, ambient temperature, intake air temperature, etc.), cooling system sensors (such as coolant temperature, fan speed, passenger compartment temperature, ambient humidity, etc.), and others (such as Hall Effect current sensors from the alternator and battery, system voltage regulator, etc.). Further, controller 12 may communicate with various actuators 18, which may include engine actuators (such as fuel injectors, an electronically controlled intake air throttle plate, spark plugs, etc.), cooling system actuators (such as motor circuit relays, etc.), and others. In some examples, the storage medium may be programmed with computer readable data representing instructions executable by the processor for performing the methods described below as well as other variants that are anticipated but not specifically listed.

Engine controller 12 may adjust the operation of cooling fans 91 and 95 based on vehicle cooling demands, vehicle operating conditions, and in coordination with engine operation. In one example, during a first vehicle moving condition, when the engine is operating, and vehicle cooling and airflow assistance from the fan is desired, cooling fans 91 and 95 may be powered by enabling battery-driven electric motors 93 and 97 to provide airflow assistance in cooling under-hood components. The first vehicle moving condition may include, for example, when an engine temperature is above a threshold. In another example, during a second vehicle moving condition, when airflow assistance is not desired (for example, due to sufficient vehicle motion-generated airflow through the under-hood compartment), fan operation may be discontinued by disabling the fan motor. In another example, during a third vehicle moving condition when an air conditioner is operational, cooling fans 91 and 95 may be activated to enable cooling of air conditioner condenser 88.

Now turning to FIG. 2, which shows a schematic diagnostic logic in block diagram 200 for detecting cooling fan degradation. An engine controller may be configured to use a logic, such as that depicted at 200, to determine when conditions to run a diagnostic are met and once met, to trigger the diagnostic for the cooling fan system.

Prior to starting the diagnostic, controller may receive inputs from various sensors at 202 to decide if necessary diagnostic entry conditions are met. For example, controller 12 may receive information from a vehicle speed sensor at 212. Controller 12 may confirm if vehicle speed is below a threshold to avoid measuring fan current when the fan is being turned due to air flow from vehicle movement. Controller 12 may also check that charging system voltage 206 is maintained within a specified range by using an analog-to-digital converter (ADC) to measure system voltage at the controller. For example, a charging voltage above or below a threshold may result in the fan being operated outside its characterized range and thus, the diagnostic may not be able to predict its expected current.

Additionally, controller 12 may also receive signals from sensors about the status of other electrical loads 216, such as an air conditioner, defrost system, headlights etc., that may draw current from the battery-alternator system. For example, when an air-conditioning system is activated, cooling fan speeds may be increased to enable cooling of the condenser and refrigerant. Further, the electromagnetic clutch connecting the compressor to the engine may also draw current from the battery-alternator system. Therefore, controller 12 may disable the cooling fan diagnostic if the air conditioner's state changes.

Once controller 12 decides that diagnostic entry conditions are met, it may communicate with low-side drivers 218 to activate relays via fan control signals FC1, FC2 and FC3. Relays may be triggered based on desired fan speed commands 204 to operate the fan system at "low", "medium" or "high" speeds or to turn the entire system off. Controller 12 may receive data on current drawn from the system via battery current sensor 208 and alternator current sensor 210. Current measurements may be obtained using Hall Effect current sensors coupled to wiring from the alternator and from the battery. Total battery-alternator system current may be determined by adding current measurements acquired from the battery and alternator.

In another example for a lower content vehicle, the alternator field duty cycle may be used to estimate alternator current while neglecting battery current.

Diagnostic test results may be communicated to diagnostic trouble code (DTC) manager 214 if a malfunction indicator lamp needs to be lit on the dashboard.

Figure 3A:
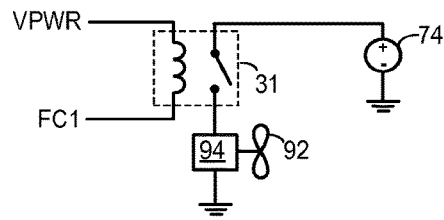
FIGS. 3A, 3B and 3C show schematic sketches of circuits for single speed, two speed and three speed fans, respectively.
Figure 3B:
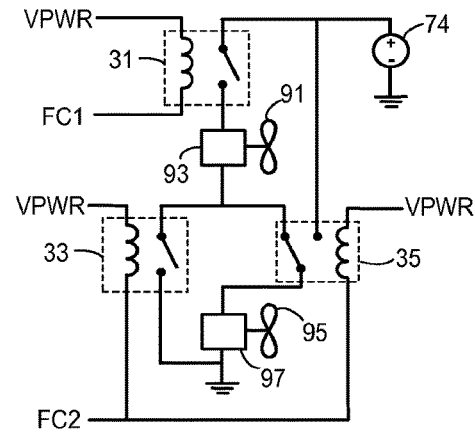
Figure 3C:
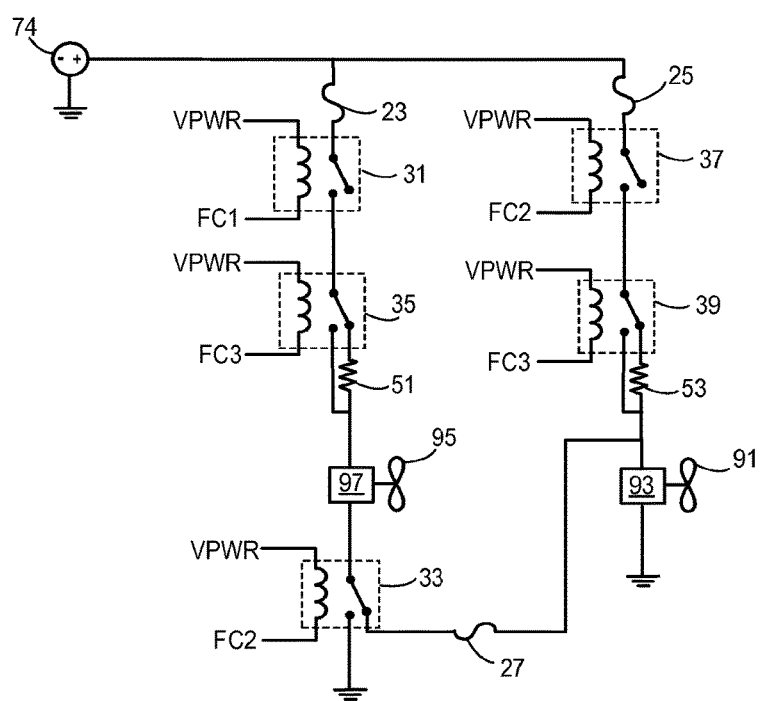

Turning now to FIGS. 3A, 3B and 3C which depict example relay configurations for a single speed fan, a two speed fan and a three speed fan respectively. FIG. 3A portrays a circuit diagram for a single speed fan 92 operated by motor 94 which is controlled by relay 31. Relay 31 may be a normally-open (NO) switch, as shown in FIG. 3A, where the switch closes to complete a circuit when the relay coil is energized. In another example, relay 31 may be a normally-closed (NC) contact which disconnects a circuit when the electromagnetic coil is energized. Relay 31 may be remotely activated by fan control signal FC1 from the controller (also known as powertrain control module (PCM)) when fan operation is needed. The electromagnetic coil within relay 31 may be energized via system voltage VPWR (also known as, vehicle power VPWR), as shown in FIG. 3A, or in other examples, may be coupled to the ignition circuit (not shown). Thus, relay 31 allows the operation of a heavy load such as motor 94 connected to fan 92 with a lower amperage circuit.

Fan 92 and motor 94 form a single speed fan system triggered by a single relay. Upon receiving signal FC1 from the PCM, relay 31 is powered and the normally-open switch closes the circuit to enable the operation of fan 92 via motor 94 drawing current from battery 74.

Continuing now to FIG. 3B, which depicts a two speed fan system operated by three relays 31, 33 and 35. Fans 91 and 95 coupled to motors 93 and 97 respectively, may be connected to battery 74 via different paths depending on which relay is energized. Relay 35 is shown as a change-over (CO) or a double-throw (DT) contact controlling two circuits with one normally-open (NO) switch and one normally-closed switch whereas relays 31 and 33 feature NO switches. Relays 31, 33 and 35 may be triggered by signals FC1 or FC2 received from PCM upon which the electromagnetic coils may be energized via system voltage VPWR. For example, upon receiving signal FC1, relay 31 may be activated which completes a circuit with fans 91 and 95 in a series connection to battery 74. With fans 91 and 95 being arranged consecutively in a series connection, there is more resistance in the circuit resulting in a low speed fan operation. In another example, the fan system may receive signals FC1 and FC2 simultaneously which triggers all relays to switch and complete a circuit where fans 91 and 95 are arranged in a parallel connection. In a parallel connection, each fan is arranged in its own circuit, thus, offering less resistance to the flow of current and thereby, a higher speed of the fan system. In this way, a system with three relays and two fan motors can provide two speeds of fan operation.

Turning now to FIG. 3C which illustrates a three speed fan system comprising 2 fans motors and 5 relays. The circuit shown in FIG. 3C features relays 31, 33, 35, 37 and 39 of which relays 31 and 37 comprise NO switches whereas relays 33, 35 and 39 include CO switches. In their non-energized condition relays 35 and 39 are connected to resistors 51 and 53 respectively. The circuit also includes fuses 23, 25 and 27 to protect the circuit and devices from excessive current flow. Relay 31 is triggered by signal FC1, relays 33 and 37 are controlled by signal FC2, and relays 35 and 39 are activated by signal FC3 from the controller. Finally, fans 91 and 95 coupled to motors 93 and 97 respectively may receive current from battery 74 when the circuits are completed by the operation of different combinations of relays.

For example, low speed operation of fans 91 and 95 may be induced by triggering signals FC1 and FC3 to activate relays 31 and 35 respectively, whereupon fan 95 via motor 97 and fan 91 via motor 93 may be connected in a series manner to battery 74. Note that signal FC3 also triggers relay 39 to drop resistor 53 but relay 37 remains inactivated and motor 93 receives current only via the series circuit. As described earlier in reference to FIG. 3B, with two fans arranged consecutively in this circuit, there is more resistance to the flow of current allowing for a low speed fan operation.

In another example, relays 31, 33 and 37 may be activated simultaneously by signals FC1 and FC2. Relays 31 and 37 are triggered to close the circuit with battery 74 while the activation of relay 33 allows resistors 51 and 53 to be in series with motors 97 and 93 respectively. Thus, the completed circuit now includes fans 91 and 95, each arranged in a series connection with a single dropping resistor. By activating relays 31, 33 and 37, fans 91 and 95 are placed in a parallel circuit with each other which allows for more current flow, and therefore, a relatively higher speed of the fan system through fan motors 93 and 97. Resistors 51 and 53 though increase the resistance and therefore, the overall speed of the fan system may be labeled as a "medium" speed upon receiving signals FC1 and FC2.

In yet another example, the fan system may be triggered by signals FC1, FC2 and FC3 whereupon all relays are concurrently energized. Herein, fans 91 and 95 are placed in a parallel connection when relays 31 and 37 are activated to close the two circuits. Additionally, resistors 51 and 53 are dropped from each circuit when relays 35 and 39 are activated enabling a higher current flow and therefore, a "high speed" operation of the fan system.

In this way, by using a combination of relays coupled to one or more fan motors, a multiple-speed fan system can be operated to assist in cooling of the engine. The controller may activate different relays depending on the temperature of the coolant and degree of cooling desired to change fan speeds from "low" to "medium" or "high" speeds. Further, the current drawn by the system as different relays are activated may be measured to estimate fan system degradation. For example, in FIG. 3C when a medium speed circulation is desired and signals FC1 and FC2 are triggered to activate relays 31, 33 and 37 to change fan speed from "off" to "medium", the current drawn increases by a certain amount. If the fan speed needs to be stepped down to "low", relays 33 and 37 are de-activated, relays 35 and 39 are activated and the current drawn decreases from previous speed. At each speed change, based on which plurality of relays is activated, an expected current draw may be known. If the measured current change deviates from an expected change, it may be determined which relay or combination of relays may be degraded.

In another example, with reference to FIG. 3B, activating relay 31 will produce a low speed fan system and a change in current is measured and compared with an expected change. If the change in current drawn deviates from an expected change, degradation in relay 31, and to a smaller extent, relay 35, may be indicated. On the other hand, activating relays 31, 33 and 35 and comparing changes in current drawn with an expected change can diagnose the condition of these three relays. As such, by comparing results with the previous measurement, degradation can be isolated to certain relays. For example, if in the former measurement, measured change in current drawn is comparable to an expected change in current drawn, it is highly likely that relay 31 is robust. If the measured change in current drawn in the latter measurement deviates from an expected current change, it can be deduced that relay 33, or to a smaller extent, relay 35, is degraded.

Figure 4:
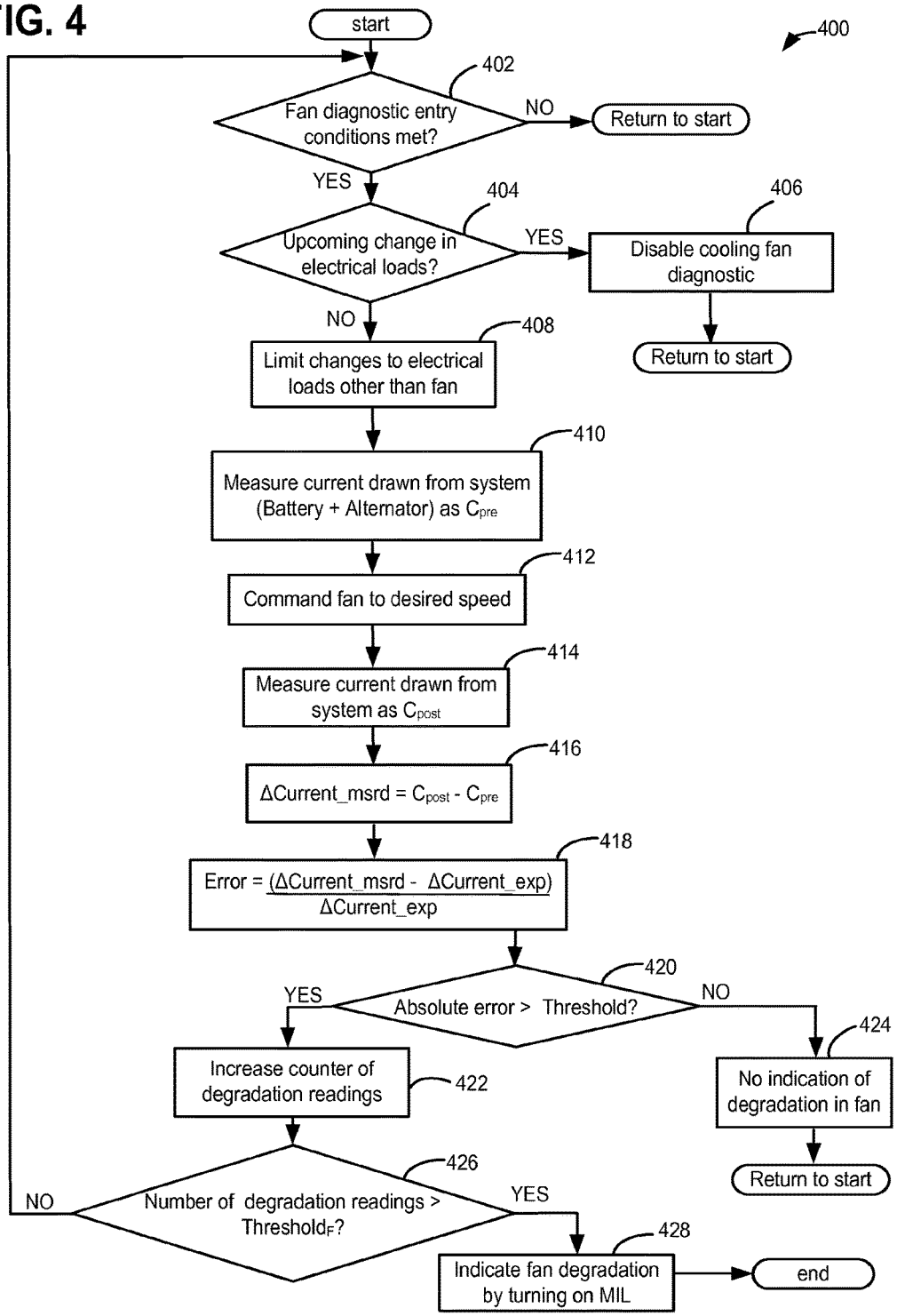
FIG. 4 is an example flowchart illustrating a diagnostic routine for a cooling fan controlled by relays.
Figure 5:
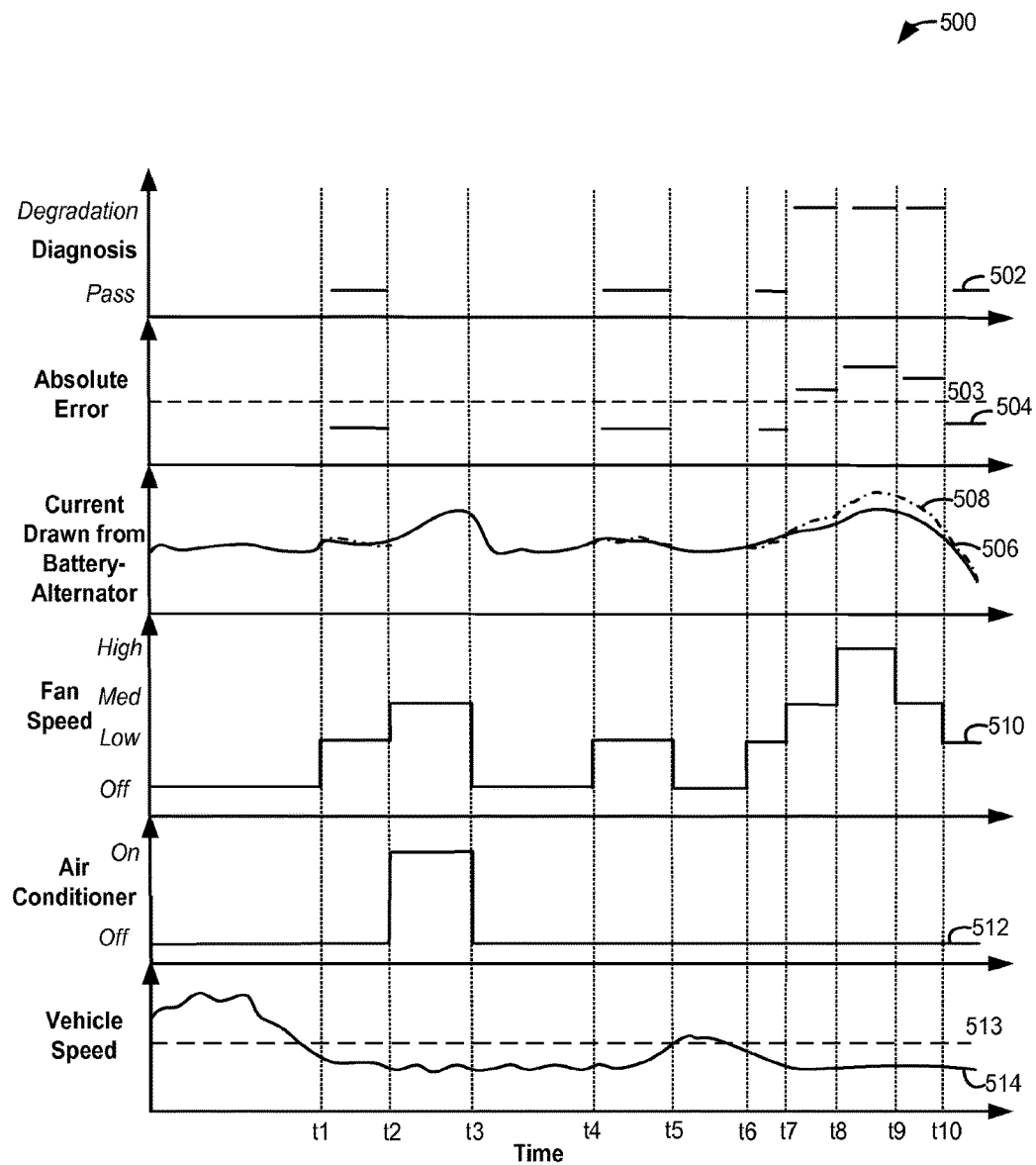
FIG. 5 is an example operation of a fan diagnostic based on vehicle conditions.

Turning to FIG. 4, which illustrates an example diagnostic routine 400 that a controller may run to check for cooling fan degradation in a relay controlled system. Fan speeds may be varied and the current draw at each speed may be measured. The change in current draw as fan speed is varied may then be compared to an expected change to diagnose the existence of fan degradation.

At 402, the routine includes estimating whether vehicle operating conditions necessary for running the fan diagnostic are met. These conditions may include vehicle speed, battery state of charge, ambient temperature, module voltage etc. For example, the diagnostic is activated only at a vehicle speed below a threshold. If vehicle speed is determined to be higher than a threshold, the controller may delay the diagnostic because there is significant air flow associated with a higher vehicle speed causing the fan to windmill, thus reducing the required current and introducing an unaccounted error into the calculation.

In another example, the controller may wait until the voltage regulator can maintain system voltage between a minimum and a maximum. If the regulated system voltage falls outside a voltage window, the expected fan current may not be characterized at that operating voltage and thus, the expected change in current may not be known accurately.

If at 402, it is determined that entry conditions are not satisfied, the routine returns to start. Once entry conditions are met, at 404, the controller may confirm that electrical loads other than the fan system which draw current from the battery-alternator system are stabilized. For example, it may be determined that the air conditioner system is operational or not. If the air conditioner has just been activated, the current drawn from the system may change as the electromagnetic compressor clutch is energized. However, once the current has stabilized, the controller can proceed with performing fan diagnostics. In one example, if the current drawn from a battery-alternator system by the air-conditioning system varies by less than 3%, it may be considered stabilized. In other examples, the variance threshold may be set at 5% to determine that other loads are stable, for example the other loads may include an AC compressor load. In each case, the controller may wait to activate the diagnostic until such loads are either more stabilized or inoperative.

If it is determined that other larger electrical loads are unstable or in transient conditions or an expected change is coming up due to drive inputs, the diagnostic may be disabled at 406 and the routine may return to start. On the other hand, if it is confirmed that other electrical loads are steady, the routine continues to 408 where the controller actively limits changes to other electrical loads to prevent any transients. Thus, not only does the controller identify conditions where the electrical loads are not changing by more than a threshold, but the controller may also delay requests from other systems to change the electrical loads. For example, even though an HVAC system may request deactivation of the air conditioner compressor, the routine may delay the deactivation until after the diagnostic routine has identified the change in current from a change in fan speed.

Continuing with routine 400, at 410, the current drawn from the battery-alternator system is measured as $C_{pre}$. This current may be current being drawn at a given moment by electrical loads inclusive of the cooling fan if the cooling fan is already operational. For example, if the air conditioner is running, the fans may be operated at a "medium" speed to enable cooling of the condenser. In another example, the cooling fans may be stopped and inoperative and the current measurement may include all electrical loads except the fan. At 412, the controller may command a change in fan speed. For example, if the fan system is already at "medium" speed, the fans may be sped up to a "high" position or may be stepped down to a "low" position. In another example, the fan system may be triggered from an "off" position to a "low" speed position.

Once a speed change has been accomplished and the fan speeds are stabilized, at 414, current drawn from the battery-alternator system is measured as Cpost. Next at 416, a difference in current drawn before and after fan speed change is calculated as ΔCurrent_msrd. The net current change as a fan system speed is varied at lower vehicle speeds may be programmed as ΔCurrent_exp into the controller memory. An expected change in current drawn by the fan system may be based not only on the commanded fan speed state but also on the system voltage. The system voltage can change for different fan speed states so the voltage may be measured before and after the commanded fan speed state change so the expected current can be properly estimated before and after the fan speed state change. Lookup tables may store the expected fan current change at each fan speed state as a function of system voltage.

At 418, ΔCurrent_msrd is compared with ΔCurrent_exp and a relative error may be established. At 420, the routine may confirm if the absolute error is greater than a maximum allowable error threshold. If it is determined that the absolute error is not greater than the allowable threshold, at 424, the routine may establish that there is no degradation in the fan system and return to start. If, however, the absolute error is found to be greater than the allowable threshold, the routine increments a degradation counter by one at 422 and proceeds to 426 where it may be confirmed if the number of degradation readings are greater than a $threshold_F$. If the number is lower than $threshold_F$, the routine returns to the start and may run the diagnostic again when entry conditions are met. If it is determined that the number of degradation readings is more than $threshold_F$, the routine indicates fan degradation at 428 and may turn on a malfunction indicator lamp (MIL) on the dashboard, and/or set a diagnostic code flag in memory indicating the type of degradation identified. Thus, fan degradation is only indicated after multiple indications are identified.

It will be appreciated that while the above example routine illustrates a diagnostic that completes; in other examples, the routine may be interrupted and terminated when changes in other electrical loads occur. For example, at 414 above, when a fan speed change has been initiated and current drawn is being measured, if the driver triggers the rear window defroster, an extra load may be placed on the battery-alternator system affecting the fan diagnostic routine. The diagnostic may be disabled based on the expected change in current drawn due to the defrost system, a counter may not be increased and any current draw measurements prior to this interruption may be discarded. Further, the diagnostic may not indicate fan system degradation even if any changes in current drawn from battery when other electrical loads are operational may be significantly different than expected current draw.

In another embodiment, by characterizing expected current draw for fan speed changes as a function of both system voltage and vehicle speed, the entry condition requirement of vehicle speed being below a threshold may be eliminated.

In yet another embodiment, a cooling fan system in an electric vehicle comprising a motorized powertrain and a DC/DC converter (in lieu of an alternator) that charges the vehicle battery may be similarly diagnosed.

An example operation of a fan diagnostic based on entry conditions, in accordance with the present disclosure, is shown at FIG. 5. Map 500 depicts fan diagnosis at plot 502, absolute relative error in current draw at plot 504, expected current draw from battery-alternator system at plot 506, measured current draw at plot 508, fan speed at 510, air conditioner operation at plot 512, and vehicle speed at plot 514. Additionally, line 503 represents the allowable absolute error threshold for change in current draw and line 513 corresponds to the vehicle speed threshold.

Prior to t1, vehicle speed is above threshold 513 and sufficient air flow is available to cool the engine. Further, as explained earlier, the controller is programmed with expected current draws at lower vehicle speeds and may wait to execute fan diagnostic until vehicle speed falls below threshold 513. Therefore, at t1, as vehicle speed decreases and stays below threshold 513 and no large electrical loads, for e.g. the air conditioner, are drawing current from the electrical system, the fan diagnostic may be activated by switching the fan from an "off" position to a "low" speed position. The measured current draw between t1 and t2 is comparable to the expected current draw and no degradation is signaled. At t2, the air conditioner is triggered, possibly by the driver, and fan speed is stepped up to "medium" which exerts an additional load on the system until t3. In addition to the change in fan speed, the electromagnetic compressor clutch may also add to the load on the battery-alternator system. The diagnostic is, therefore, interrupted and ended at t2. Any data collected prior to t2 is thrown away and the controller waits for entry conditions to be met again which does not occur until t4.

Between t3 and t4, air conditioner operation is cutoff and current draw stabilizes while vehicle speed remains below the threshold and therefore, at t4 it is determined that entry conditions for diagnostic are met. At t4, the fan speed is increased to a "low" position and once fan speed has stabilized, multiple current draw readings are obtained. The measured current draw at plot 508 between t4 and t5 is similar to an expected current draw (plot 506) and the absolute error being below threshold 503, no degradation is flagged.

At t5, the vehicle speed goes above the threshold and the diagnostic is terminated. At t6, the diagnostic may be activated again since entry conditions are met and the fan speed is increased from "off" to "low" position, followed by a step up to "medium" speed position at t7 and later, advanced to a "high" speed position at t8. As diagnostic entry conditions continue to be met, fan speed is lowered from "high" to "medium" position at t9 and at t10, the fan speed is stepped down to "low". At each speed change, multiple readings of the variation in current draw are acquired and compared to the expected current draw. Plot 508 depicting measured current draw is higher than the expected current draw shown at plot 506 between t7 and t10, thus, indicating an absolute relative error above allowable threshold 503 and a subsequent notification of degradation between t7 and t10 (plot 502).

Note that plots 502 and 504 begin a short time after diagnostic starts and fan speed changes at t1, t4, t6, t7, t8, t9, t10 to indicate that the diagnostic must allow a settle time before calculating an error or a pass/fail analysis.

It will be appreciated that while the depicted example incorporates additional electrical loads in the form of an air conditioner, other electrical loads may also include the defrost system, headlights etc. Further, system voltage may be maintained within a predetermined range to enable implementation of the fan diagnostic.

In this way, a cooling fan diagnostic analysis may be run during normal operating conditions of a vehicle. By ensuring that other larger electrical loads are stable and unvarying during the diagnostic, variation in current drawn from a battery-alternator system can be attributed to the fan system. Fan degradation due to degradation in relay circuits can be diagnosed by comparing the measured change in current to an expected change as fan speeds are varied. In addition, relay controlled fan systems can be checked for degradation by utilizing existing hardware without additional sensors, thus resulting in cost savings.

In another example, a method is provided for a relay-controlled multiple-speed cooling fan system of a vehicle. The method includes, delaying requests for changing an accessory current draw while commanding a modification in cooling fan speed by actuating a fan relay; and correlating a change in current drawn from a battery with cooling fan system degradation based on which fan relay was actuated. The request for changing the accessory current draw (e.g., a request to increase or decrease a compressor speed, for example) may be delayed until after the fan relays are actuated and the change in current identified. In this way, the degradation can be better identified, and indicated, without interference from the changing accessory current drawn.

Note that the example control and estimation routines included herein can be used with various engine and/or vehicle system configurations. The control methods and routines disclosed herein may be stored as executable instructions in non-transitory memory. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the engine control system.

It will be appreciated that the configurations and routines disclosed herein are exemplary in nature, and that these specific embodiments are not to be considered in a limiting sense, because numerous variations are possible. For example, the above technology can be applied to various cooling system configurations. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method comprising:
when other electrical loads are stable:
measuring a first current drawn from a battery-alternator system including a battery coupled to an alternator and to a plurality of relays of a relay-controlled multiple-speed cooling fan system of an engine before a speed of the cooling fan system changes and a second current drawn from the battery-alternator system after the speed of the cooling fan system changes; and indicating whether the fan system is degraded based on a difference between the first and second currents and further based on activation of the plurality of relays of the relay-control multiple-speed cooling fan system.

2. The method of claim 1, further comprising aborting the measuring if the other electrical loads change by more than a threshold.

3. The method of claim 2, further comprising:
calculating an error between the difference between the first and second currents and an expected change in current drawn from the battery-alternator system, wherein the expected change in current drawn is based on which of the plurality of relays are activated.

4. The method of claim 3, wherein the indication of degradation is based on the calculated error.

5. The method of claim 1, wherein the current is measured only when vehicle speed is below a threshold.

6. The method of claim 1, further comprising:
disabling the fan current measurement when changes in the other electrical loads are expected based on driver inputs.

7. The method of claim 1, wherein fan speed is adjusted by adjusting actuation of one or more of the plurality of relays.

8. The method of claim 1, further comprising determining which of the plurality of relays are degraded based on the difference between the first and second currents and further based on which of the plurality of relays are activated.

9. A method comprising:
when all electrical loads are unchanging:
measuring a first current drawn from a battery-alternator system coupled to a plurality of relays of a relay-controlled multiple-speed cooling fan system of a vehicle;
commanding a modification in cooling fan speed by actuating one or more relays;
measuring a second current drawn from the battery-alternator system after the modification in cooling fan speed;
determining an expected difference between the first and second currents based on which fan relays were actuated;
comparing the expected difference with a difference between the measured first and second currents; and
based on the comparison, indicating whether the cooling fan system is degraded.

10. The method of claim 9, wherein the electrical loads include an air-conditioning compressor, a vehicle entertainment system, and a rear defrost system.

11. The method of claim 10, wherein the modification is commanded only when vehicle speed is lower than a threshold.

12. The method of claim 10, wherein the modification is commanded only when charging system voltage is greater than a minimum threshold but less than a maximum voltage threshold.

13. The method of claim 9, further comprising determining which of the one or more fan relays are degraded based on the expected difference.

14. A system for a vehicle comprising:
a plurality of cooling fans coupled with an engine;
a battery-alternator system coupled with the cooling fans; and
a controller with computer readable instructions stored in non-transitory memory for:
when the vehicle is moving slower than a threshold:
during a first condition, when other electrical loads are maintained steady, measuring a first current drawn from the battery-alternator system;
altering one or more cooling fan speeds and then measuring a second current drawn from the battery-alternator system;
determining an expected difference between the first and second currents; and
indicating fan system degradation based on a comparison of the expected difference and a difference between the measured first and second currents; and
during a second condition, when other electrical loads are varying, disabling cooling fan diagnostic.

15. The system of claim 14, wherein disabling cooling fan diagnostics includes not indicating fan system degradation even when a change in current drawn from the battery-alternator system during the varying electrical loads differs by more than a threshold from an expected change in current while alternating fan speed.

16. The system of claim 15, wherein an engine cooling fan motor coupled to one of the cooling fans is controlled by a plurality of relays.

17. The system of claim 16, further comprising determining which of the plurality of relays are degraded based on the expected difference.

18. The system of claim 14, wherein indicating fan system degradation based on the comparison of the expected difference and the difference between the measured first and second currents further comprises determining an absolute value of a difference between the expected difference and the difference between the measured first and second currents, and comparing the absolute value with an allowable threshold.

19. The system of claim 18, wherein cooling fan system degradation is indicated when the absolute value is above the allowable threshold.

20. The system of claim 14, wherein the expected difference is based on which of the plurality of relays are activated after the alteration of the one or more cooling fan speeds.

\* \* \* \* \*